US012639039B2

(12) United States Patent
Lee et al.

(10) Patent No.: US 12,639,039 B2
(45) Date of Patent: May 26, 2026

(54) APPARATUS AND METHOD WITH MULTIPLY-ACCUMULATE OPERATION

(71) Applicant: Samsung Electronics Co., Ltd., Suwon-si (KR)

(72) Inventors: Hyungwoo Lee, Seoul (KR); Sang Joon Kim, Hwaseong-si (KR); Seok Ju Yun, Hwaseong-si (KR); Seungchul Jung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1161 days.

(21) Appl. No.: 17/546,523

(22) Filed: Dec. 9, 2021

(65) Prior Publication Data

US 2022/0357922 A1 Nov. 10, 2022

(30) Foreign Application Priority Data

May 6, 2021 (KR) ......................... 10-2021-0058338

(51) Int. Cl.
*G06F 7/544* (2006.01)
*G06G 7/16* (2006.01)
*H03M 1/38* (2006.01)

(52) U.S. Cl.
CPC ............. *G06F 7/5443* (2013.01); *G06G 7/16* (2013.01); *H03M 1/38* (2013.01)

(58) Field of Classification Search
CPC ......... G06F 7/5443; G06F 17/16; G06G 7/16; G06G 7/18; G06G 7/22
See application file for complete search history.

(56) References Cited

U.S. PATENT DOCUMENTS

| | | | |
|---|---|---|---|
| 8,310,388 B2 | 11/2012 | Chang et al. | |
| 9,608,652 B2 | 3/2017 | Lee et al. | |
| 10,103,742 B1 * | 10/2018 | Guo ...................... | H03M 1/145 |
| 10,868,554 B1 | 12/2020 | Reitsma et al. | |
| 11,095,301 B1 * | 8/2021 | Tang ................... | H03M 1/1014 |
| 2006/0087468 A1 * | 4/2006 | Oka ...................... | H03M 1/069 |
| | | | 341/155 |

(Continued)

FOREIGN PATENT DOCUMENTS

| | | |
|---|---|---|
| JP | 2012-49635 A | 3/2012 |
| KR | 10-2014-0063059 A | 5/2014 |

(Continued)

OTHER PUBLICATIONS

Oh, Dong-Ryeol, et al. "An 8-bit 1-GS/s asynchronous loop-unrolled SAR-flash ADC with complementary dynamic amplifiers in 28-nm CMOS." IEEE Journal of Solid-State Circuits 56.4 (2020): 1216-1226. (Year: 2020).*

(Continued)

*Primary Examiner* — Matthew D Sandifer
(74) *Attorney, Agent, or Firm* — NSIP Law

(57) ABSTRACT

A multiply-accumulate (MAC) computation circuit includes: a bit-cell array configured to generate an analog output corresponding to a MAC operation result of an input signal; a first analog-to-digital conversion (ADC) circuit configured to determine an upper part of a digital output corresponding to the analog output; and a second ADC circuit configured to determine a lower part of the digital output based on a reference voltage corresponding to the upper part.

24 Claims, 15 Drawing Sheets

(56)                  References Cited

U.S. PATENT DOCUMENTS

| | | | |
|---|---|---|---|
| 2011/0084866 A1* | 4/2011 | Hsu | H03M 1/16 |
| | | | 341/156 |
| 2013/0027232 A1 | 1/2013 | Liu et al. | |
| 2016/0065231 A1* | 3/2016 | Gonen | H03M 1/42 |
| | | | 341/156 |
| 2021/0064367 A1 | 3/2021 | Kim et al. | |
| 2021/0271959 A1* | 9/2021 | Chettuvetty | G06F 7/5443 |
| 2021/0366542 A1 | 11/2021 | Lee et al. | |

FOREIGN PATENT DOCUMENTS

| | | |
|---|---|---|
| KR | 10-2017-0069140 A | 6/2017 |
| KR | 10-1844555 B1 | 4/2018 |

OTHER PUBLICATIONS

Dhage, Priyanka, and Pradnya Jadhav. "Design of power efficient hybrid flash-successive approximation register analog to digital converter." 2017 International Conference on Communication and Signal Processing (ICCSP). IEEE, 2017. (Year: 2017).*

Korean Office Action issued on Mar. 11, 2025, in corresponding Korean Patent Application No. 10-2021-0058338. (8 pages in English, 10pages in Korean).

Tai, Hung-Yen et al., "11.2 A 0.85fJ/conversion-step 10b 200kS/s subranging SAR ADC in 40nm CMOS," IEEE International Solid-State Circuits Conferences (ISSCC), 2014, (3 Pages in English).

Xing, Dezhi et al., "Design of a High-Speed Time-Interleaved Sub-Ranging SAR ADC With Optimal Code Transfer Technique," IEEE Transactions of Circuits and Systems, vol. 66, No. 2, 2019, (13 Pages in English).

Correll, Justin et al., "A Fully Integrated Reprogrammable CMOS-RRAM Compute-in-Memory Coprocessor for Neuromorphic Applications," IEEE Journal on Exploratory Solid-State Computational Devices and Circuits, vol. 6, No. 1, 2020, (9 Pages in English).

Extended European Search Report Issued on Sep. 23, 2022, in counterpart European Patent Application No. 22166926.0 (7 Pages in English).

European Office Action issued on Oct. 21, 2025, in counterpart European Patent Application No. 22166926.0(7 pages in English).

Kim, Seung-Bum, and Kee-Won Kwon. "A hybrid ADC combining capacitive DAC-based multi-bit/cycle SAR ADC with flash ADC." 2016 *International Conference on Electronics, Information, and Communications* (*ICEIC*). IEEE, Jan. 2016(pp. 1-4).

Oh, Dong-Ryeol, et al. "An 8b 1GS/s 2.55 mW SAR-Flash ADC with Complementary Dynamic Amplifiers." *IEEE Symposium on VLSI Circuits*. IEEE, 2020. (2 pages in English).

Dong, Qing, et al. "15.3 a 351TOPS/W and 372.4 GOPS compute-in-memory SRAM macro in 7nm FinFET CMOS for machine-learning applications." *IEEE International Solid-State Circuits Conference vol. 15 No. 3—(ISSCC)*. IEEE, 2020. (3 pages in English).

Huang, Shanshi, et al. "New Security Challenges on Machine Learning Inference Engine: Chip Cloning and Model Reverse Engineering." arXiv:2003.09739 2020 (9 pages in English).

Japanese Office Action issued on Dec. 16, 2025, in counterpart Japanese Patent Application No. 2022-029195(3 pages in English, 5 pages in Japanese).

* cited by examiner

APPARATUS AND METHOD WITH MULTIPLY-ACCUMULATE OPERATION

CROSS-REFERENCE TO RELATED APPLICATIONS

This application claims the benefit under 35 USC § 119(a) of Korean Patent Application No. 10-2021-0058338, filed on May 6, 2021, in the Korean Intellectual Property Office, the entire disclosure of which is incorporated herein by reference for all purposes.

BACKGROUND

1. Field

The following description relates to an apparatus and method with a multiply-accumulate (MAC) operation.

2. Description of Related Art

A vector matrix multiplication operation, also known as a multiply-accumulate (MAC) operation, may have an influence on the performance of applications. For example, in machine learning and authentication operations of a neural network including multiple layers, a MAC operation may be performed. An input signal may be regarded to form an input vector and may be data for an image, a byte stream, or other data sets. An output vector may be obtained from a result of a MAC operation obtained by multiplying an input signal by a weight and accumulating a product of the input signal and the weight, and may be provided as an input vector for a next layer. When such a MAC operation is repeated for a plurality of layers, the neural network processing performance may depend on the performance of the MAC operation.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a multiply-accumulate (MAC) computation circuit includes: a bit-cell array configured to generate an analog output corresponding to a MAC operation result of an input signal; a first analog-to-digital conversion (ADC) circuit configured to determine an upper part of a digital output corresponding to the analog output; and a second ADC circuit configured to determine a lower part of the digital output based on a reference voltage corresponding to the upper part.

For the determining of the upper part, the first ADC circuit may be configured to compare the analog output to coarse ranges according to primary reference voltages and determine a first range to which the analog output belongs among the coarse ranges, and the first range may correspond to the upper part of the digital output.

For the determining of the lower part, the second ADC circuit may be configured to compare the analog output to fine ranges of the first range according to secondary reference voltages including the reference voltage and determine a second range to which the analog output belongs among the fine ranges, and the second range may correspond to the lower part of the digital output.

The primary reference voltages may be set based on the analog output.

The first ADC circuit may be a successive approximation register (SAR) ADC circuit, and the second ADC circuit may be a flash ADC circuit.

The digital output may be 6 bits wide, the upper part may be 2 bits wide, and the lower part may be 4 bits wide.

The bit-cell array may include a plurality of input lines and a plurality of output lines, and a first analog output of a first output line among the plurality of output lines may correspond to a result of a first MAC operation performed between voltage values applied to the first output line by the input signal and resistance values of bit-cells belonging to the first output line.

The MAC computation circuit may include a capacitor array configured to convert a current value of the analog output into a voltage value.

The bit-cell array may include a plurality of bit-cell groups that each comprise a plurality of output lines, and first output lines belonging to a first bit-cell group among the plurality of bit-cell groups may share a first ADC block and a first capacitor array assigned to the first bit-cell group.

The first capacitor array may include: a first capacitor configured to sample outputs of output lines of a first sub-group among the first output lines; and a second capacitor configured to sample outputs of output lines of a second sub-group among the first output lines.

The first ADC block may include the first ADC circuit and the second ADC circuit, and the first ADC circuit and the second ADC circuit may operate based on a pipeline.

The first ADC circuit may be configured to determine a digital upper part of an output of an output line of the first sub-group for a first time interval, the second ADC circuit may be configured to determine a digital lower part of the output of the output line of the first sub-group for a second time interval, the first ADC circuit may be configured to determine a digital upper part of an output of an output line of the second sub-group for a third time interval, and at least a portion of the third time interval may overlap the second time interval according to the pipeline.

An even-numbered output line among the first output lines may belong to the first sub-group, and an odd-numbered output line among the first output lines may belong to the second sub-group.

The MAC computation circuit may include a plurality of capacitor arrays configured to sample the analog output, a plurality of first ADC circuits comprising the first ADC circuit, and a plurality of second ADC circuits comprising the second ADC circuit.

In another general aspect, an electronic apparatus includes the MAC computation and a processor configured to generate a recognition result of an input corresponding to the input signal, based on the digital output.

In another general aspect, a multiply-accumulate (MAC) computation circuit includes: a bit-cell array configured to generate an analog output corresponding to a MAC operation result of an input signal, using a plurality of bit-cell groups, each comprising a plurality of output lines; a plurality of capacitor arrays configured to sample the analog output, the plurality of capacitor arrays being assigned to each of the plurality of bit-cell groups; a plurality of first analog-to-digital conversion (ADC) circuits configured to determine an upper part of a digital output corresponding to the analog output, the plurality of first ADC circuits being connected to the plurality of capacitor arrays; and a plurality of second ADC circuits configured to determine a lower part of the digital output based on a reference voltage corresponding to the upper part.

The MAC computation circuit may include: a reference generator configured to generate reference voltage candidates; and a reference selector configured to select the reference voltage corresponding to the upper part of the digital output among the reference voltage candidates.

For the generating of the reference voltage candidates, the reference generator may be configured to determine at least a portion of the reference voltage candidates based on the analog output.

First output lines belonging to a first bit-cell group among the plurality of bit-cell groups may share a first capacitor array, a first ADC circuit, and a second ADC circuit that are assigned to the first bit-cell group among the plurality of capacitor arrays, the plurality of first ADC circuits, and the plurality of second ADC circuits.

The first capacitor array may include: a first capacitor configured to sample outputs of output lines of a first sub-group among the first output lines; and a second capacitor configured to sample outputs of output lines of a second sub-group among the first output lines, and the first ADC circuit and the second ADC circuit may operate based on a pipeline.

For the determining of the upper part, the first ADC circuits may be configured to compare the analog output to coarse ranges according to primary reference voltages and determine a first range to which the analog output belongs among the coarse ranges, and for the determining of the lower part, the second ADC circuits may be configured to compare the analog output to fine ranges of the first range according to secondary reference voltages including the reference voltage and determine a second range to which the analog output belongs among the fine ranges.

In another general aspect, a multiply-accumulate (MAC) computation method includes: generating an analog output corresponding to a MAC operation result of an input signal, using a bit-cell array; determining an upper part of a digital output corresponding to the analog output, using a first analog-to-digital conversion (ADC) circuit; setting a reference voltage of a second ADC circuit based on the upper part; and determining a lower part of the digital output, using the second ADC circuit.

In another general aspect, an electronic apparatus includes: a bit-cell array configured to generate an analog output corresponding to a multiply-accumulate (MAC) operation result of an input signal; a first analog-to-digital conversion (ADC) circuit configured to determine high-order bits of a digital output corresponding to the analog output by comparing the analog output to one or more primary reference values determined based on a maximum value of an input signal value range; and a second ADC circuit configured to determine low-order bits of the digital output by comparing the analog output to one or more secondary reference values determined based on the primary reference values.

For the determining of the high-order bits, the first ADC circuit may be configured to determine a highest-order bit of the high-order bits by comparing the analog output to a primary reference value of the one or more primary reference values that is half of the maximum value of the input signal value range.

A value of the analog output and the secondary reference values may be within a range of a first primary reference value and a second primary reference value of the one or more primary reference values.

The apparatus may include a processor configured to generate a recognition result of an input corresponding to the input signal, based on the digital output.

Other features and aspects will be apparent from the following detailed description, the drawings, and the claims.

Figure 1:
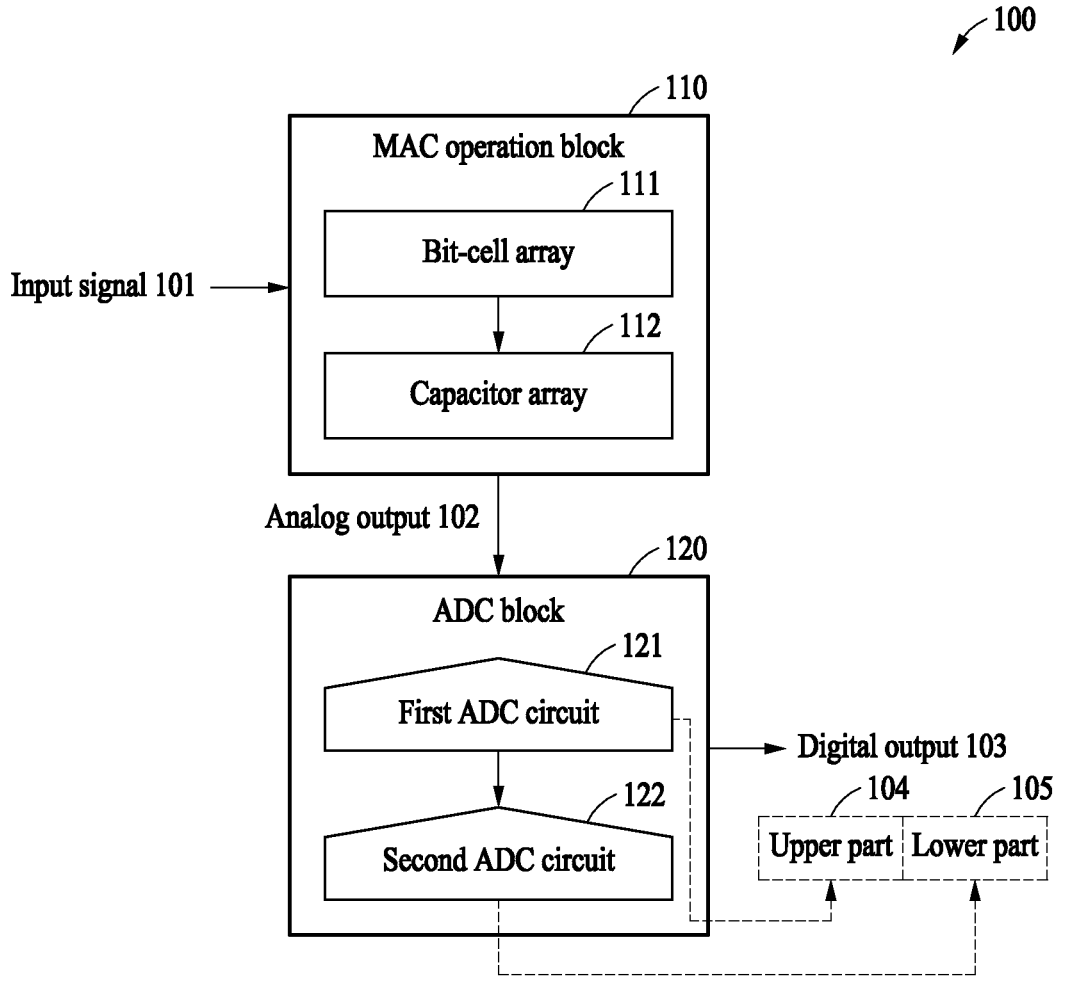
FIG. 1 illustrates an example of a structure and an operation of a multiply-accumulate (MAC) computation circuit.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known, after an understanding of the disclosure of this application, may be omitted for increased clarity and conciseness.

Although terms of "first" or "second" are used herein to describe various members, components, regions, layers, or sections, these members, components, regions, layers, or sections are not to be limited by these terms. Rather, these terms are used only to distinguish one member, component, region, layer, or section from another member, component, region, layer, or section. For example, a "first" member, component, region, layer, or section referred to in examples described herein may also be referred to as a "second" member, component, region, layer, or section without departing from the teachings of the examples.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. Likewise, expressions, for example, "between" and "immediately between" and "adjacent to" and "immediately adjacent to" may also be construed as described in the foregoing.

The terminology used herein is for the purpose of describing particular examples only and is not to be limiting of the examples. As used herein, the singular forms "a," "an," and "the" are intended to include the plural forms as well, unless the context clearly indicates otherwise. As used herein, the term "and/or" includes any one and any combination of any two or more of the associated listed items. As used herein, the terms "include," "comprise," and "have" specify the presence of stated features, numbers, operations, elements, components, and/or combinations thereof, but do not preclude the presence or addition of one or more other features, numbers, operations, elements, components, and/or combinations thereof. The use of the term "may" herein with respect to an example or embodiment (for example, as to what an example or embodiment may include or implement) means that at least one example or embodiment exists where such a feature is included or implemented, while all examples are not limited thereto.

Unless otherwise defined, all terms used herein including technical or scientific terms have the same meanings as those generally understood consistent with and after an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

Hereinafter, examples will be described in detail with reference to the accompanying drawings. When describing the examples with reference to the accompanying drawings, like reference numerals refer to like components and a repeated description related thereto will be omitted.

FIG. 1 illustrates an example of a structure and an operation of a multiply-accumulate (MAC) computation circuit. Referring to FIG. 1, a MAC computation circuit 100 may output a digital output 103 in response to an input of an input signal 101. The MAC computation circuit 100 may include a MAC operation block 110, and an analog-to-digital conversion (ADC) block 120. The MAC operation block 110 may perform a MAC operation based on the input signal 101, and may output an analog output 102 corresponding to a result of the MAC operation. The ADC block 120 may convert the analog output 102 into the digital output 103 based on hybrid ADCs.

The MAC operation block 110 may include a bit-cell array 111 and a capacitor array 112. The bit-cell array 111 may include a plurality of bit cells in the form of an array. The bit-cell array 111 may perform a memory function of storing a weight, and a function of performing a MAC operation between an input value and a weight value. A bit cell may include a resistance device and/or a memory device. For example, the bit cell may correspond to a resistive memory device.

Each row of the bit-cell array 111 may form an input line, and each column of the bit-cell array 111 may form an output line. For example, an input value of one bit cell may be a value of a voltage applied to the bit cell by the input signal 101, and a weight value of the bit cell may be a resistance value of the bit cell. Also, an output value of the bit cell may be a product of the input value and the resistance value and may correspond to a current value. Currents of an output line to which the bit cell belongs may be summed to form an analog output 102 of the output line. The capacitor array 112 may perform a sampling operation based on the analog output 102. For example, the capacitor array 112 may convert a current value of the analog output 102 into a voltage value through a sample-and-hold operation.

The ADC block 120 may include a first ADC circuit 121 and a second ADC circuit 122. The first ADC circuit 121 may determine an upper part 104 (e.g., high-order bits) of the digital output 103 corresponding to the analog output 102 based on the analog output 102. When a reference voltage corresponding to the upper part 104 is determined, the second ADC circuit 122 may determine a lower part 105 (e.g., low-order bits) of the digital output 103 based on the analog output 102 and the reference voltage. For example, the first ADC circuit 121 may be a successive approximation register (SAR) ADC circuit, and the second ADC circuit 122 may be a flash ADC circuit. The upper part 104 may correspond to P bits starting from a most significant bit (MSB) of the digital output 103, and the lower part 105 may correspond to Q bits starting from a least significant bit (LSB) of the digital output 103. For example, P may be "2" and Q may be "4". The digital output 103 may have a precision of "P+Q" bits.

The digital output 103 may be transmitted to a digital core. For example, the digital core may be a processor. A neural network may be executed through a neural network operation including a MAC operation. The processor may execute the neural network by performing a MAC operation using the MAC computation circuit 100. For example, the bit-cell array 111 may store a neural network model (for example, network parameters such as weights) and the processor may apply the input signal 101 corresponding to an input of the neural network to the MAC computation circuit 100. When the analog output 102 and the digital output 103 are generated by the MAC computation circuit 100, the processor may use the digital output 103 as a result of the MAC operation.

Figure 2:
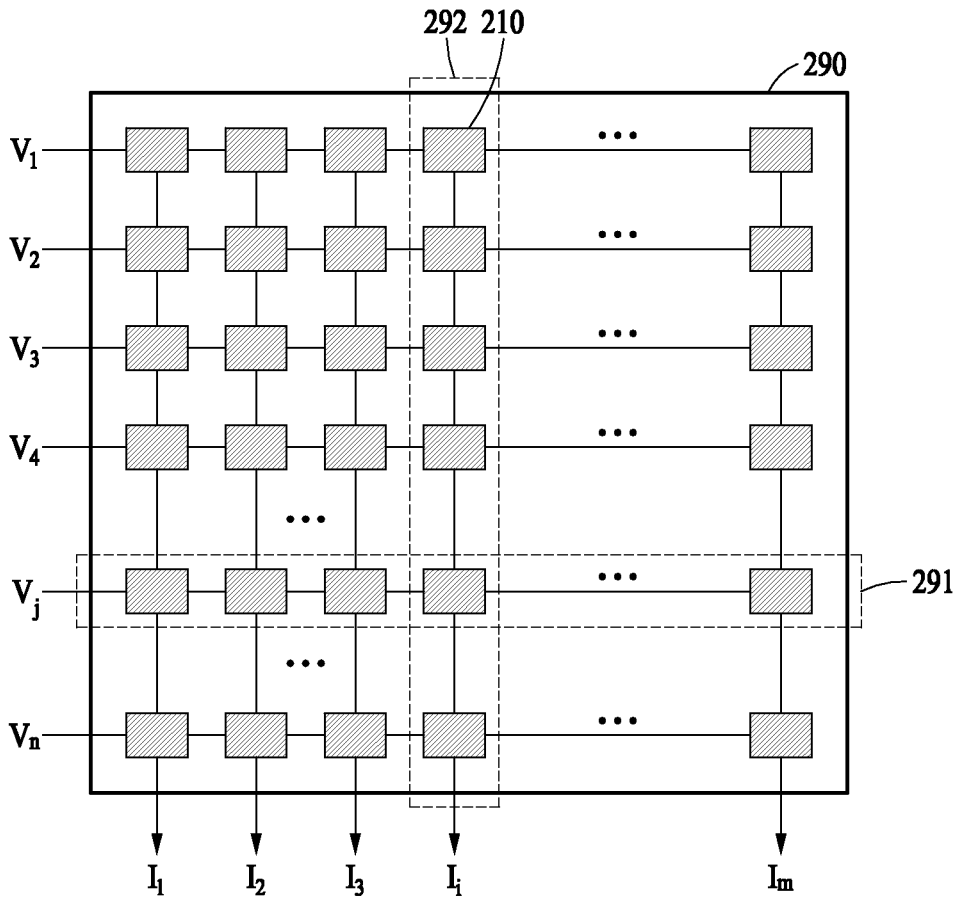
FIG. 2 illustrates an example of a structure of a bit-cell array.

FIG. 2 illustrates an example of a structure of a bit-cell array. Referring to FIG. 2, a bit-cell array 290 may include a plurality of input lines that may individually receive input signals, and a plurality of output lines that may individually output output signals. Input signals may be input through input voltages $V_1$ to $V_n$, and output signals may be output through output currents $I_1$ to $I_m$. An output signal may correspond to an analog output. Each of the plurality of output lines may include a plurality of bit cells. A bit cell may perform a memory function of storing a weight, and a function of performing a multiplication between an input value and a weight value. The bit cell may include a resistance device and/or a memory device, and the bit-cell array 290 may perform a memory function of storing a weight, and a function of performing a MAC operation between an input value and a weight value. Each of the plurality of input lines may intersect the plurality of output lines. For example, the bit-cell array 290 may include "n"

input lines and "m" output lines. In an example, an i-th analog output $l_i$ of an i-th output line 292 among the plurality of output lines may correspond to a result of a MAC operation performed between values of the voltages $V_1$ to $V_n$ applied to the i-th output line 292 by the input signals and resistance values of bit cells (e.g., including a bit cell 210) belonging to the i-th output line 292. The input lines and the output lines intersect perpendicular to each other as shown in FIG. 2, however, examples are not limited thereto.

A plurality of bit cells may be arranged along the plurality of output lines and the plurality of input lines. For example, the plurality of bit cells may be arranged for each of the plurality of input lines along an output line. Each of the plurality of bit cells may be configured to receive a voltage through an input line in which each of the bit cells is arranged among the plurality of input lines. For example, bit cells arranged along a j-th input line 291 may receive an input voltage $V_j$ as an input signal. The input voltages $V_1$ to $V_n$ may have voltage values indicating binary values. For example, an input voltage signal indicating a bit value of "1" may represent a set voltage, and an input voltage signal indicating a bit value of "0" may represent a floating voltage. The bit-cell array 290 may correspond to a memory array due to its the memory function. Also, the bit-cell array 290 may correspond to an accelerator because the bit-cell array 290 performs a specialized computation function.

The output signals may be applied to a plurality of capacitors through the output lines. The plurality of capacitors may form an array. The plurality of capacitors may be individually arranged for each of the plurality of output lines, or arranged for each of output lines included in a predetermined group. Each of the plurality of capacitors may be connected to bit cells arranged along an output line in which each of the capacitors is disposed among the plurality of output lines. Each of the plurality of capacitors may be changed in response to voltages being received through corresponding bit cells. For example, a capacitor disposed in the i-th output line 292 may be charged according to voltages applied to bit cells arranged in the i-th output line 292. Accordingly, each of the capacitors may sample a voltage value corresponding to a current output. For example, a capacitor may perform a sample-and-hold operation. The plurality of capacitors may have the same capacitance.

Figure 3:
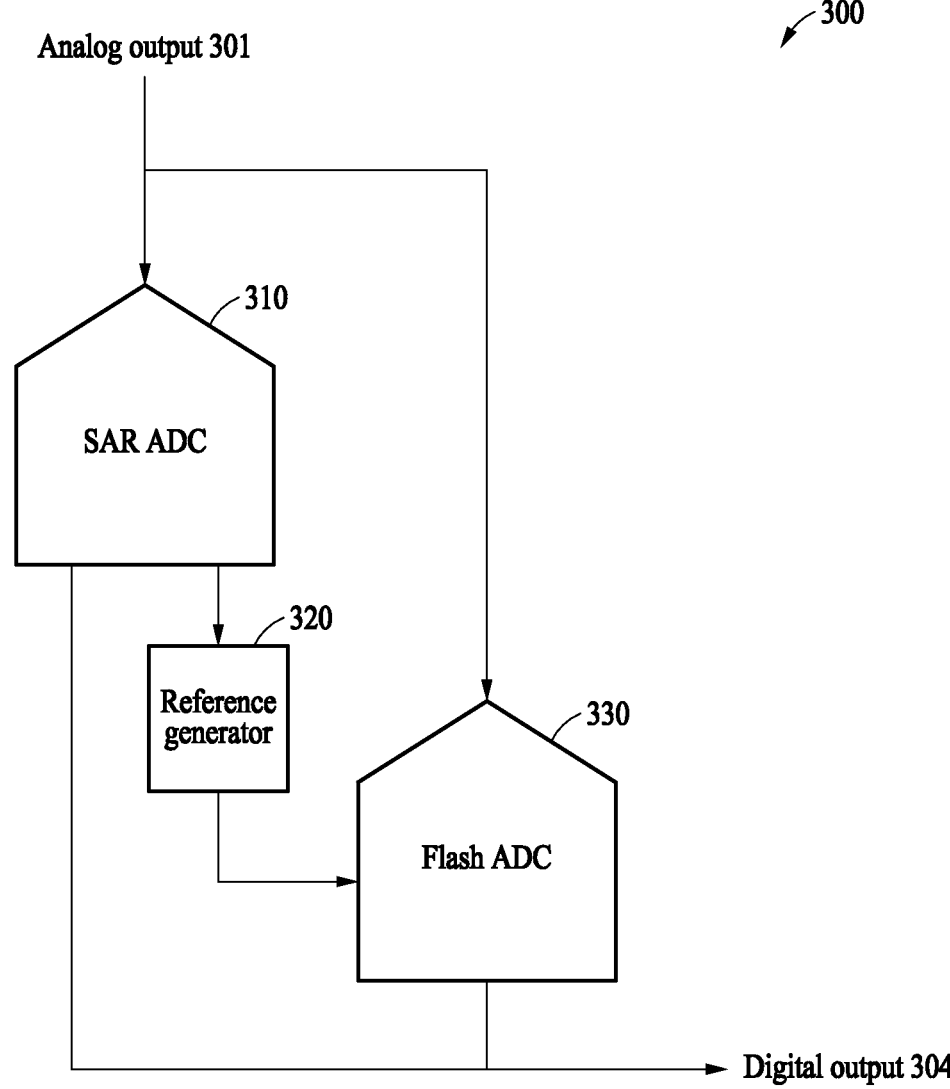
FIG. 3 illustrates an example of a structure of an analog-to-digital conversion (ADC) block.

FIG. 3 illustrates an example of a structure of an ADC block. Referring to FIG. 3, an ADC block 300 may include a SAR ADC circuit 310, a reference generator 320, and a flash ADC circuit 330. In a non-limiting example, the SAR ADC circuit 310 and the flash ADC circuit 330 may respectively correspond to the first ADC circuit 121 and the second ADC circuit 122 of FIG. 1. The SAR ADC circuit 310 may determine an upper part of a digital output 304 based on an analog output 301. The SAR ADC circuit 310 may compare the analog output 301 to coarse ranges according to primary reference voltages, and may determine a first range to which the analog output 301 belongs among the coarse ranges. The first range may correspond to an upper part of the digital output 304. The reference generator 320 may determine secondary reference voltages based on at least a portion of reference voltages that set the first range among the primary reference voltages. The secondary reference voltages may form fine ranges of the first range. The flash ADC circuit 330 may compare the fine ranges to the analog output 301, and may determine a second range to which the analog output 301 belongs among the fine ranges. The second range may correspond to a lower part of the digital output 304.

Figure 4:
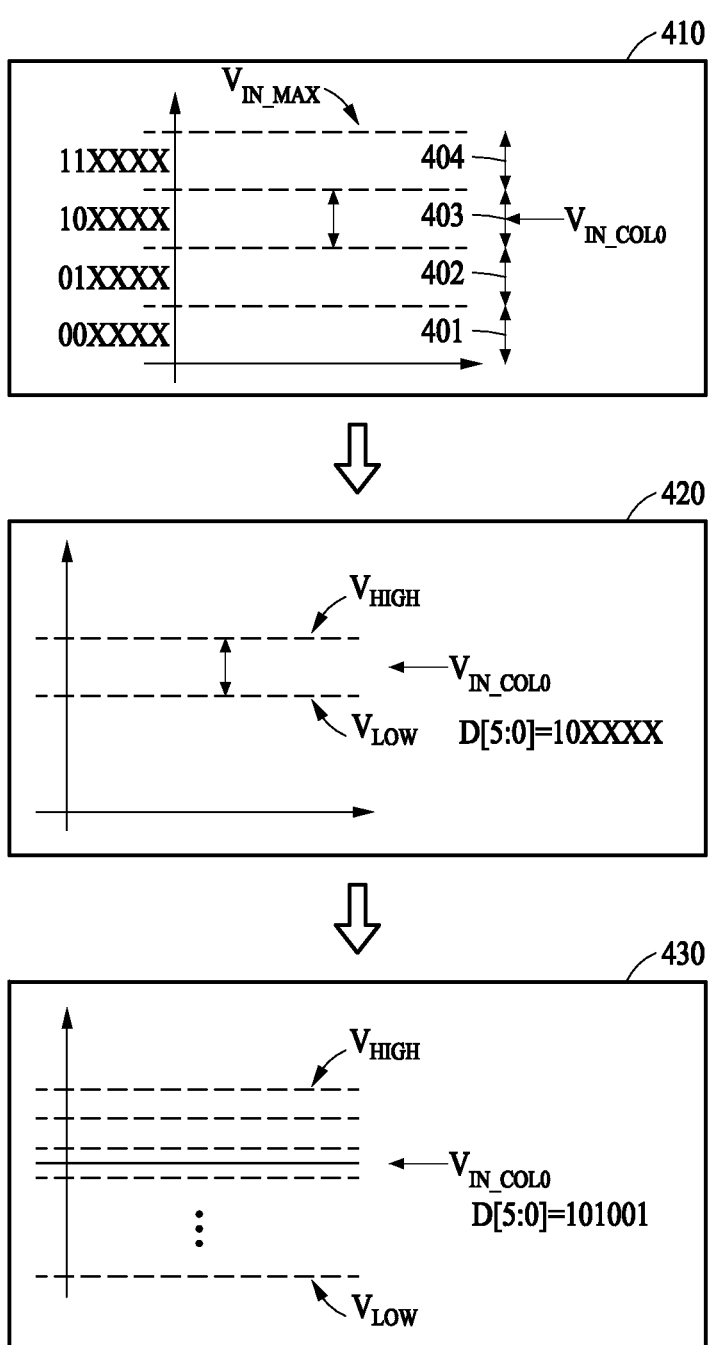
FIG. 4 illustrates an example of operations of determining an upper part and a lower part of a digital output.

FIG. 4 illustrates an example of operations of determining an upper part and a lower part of a digital output. Referring to FIG. 4, in a first box 410, primary reference voltages may be generated based on a maximum reference voltage $V_{IN\_MAX}$, and may form coarse ranges 401 to 404. Although a non-limiting example in which a digital upper part is 2 bits wide and a digital lower part is 4 bits wide is shown in FIG. 4, a number of bits of each of the digital upper part and the digital lower part is not limited thereto, and according to other examples, the digital upper part may be less than or more than 2 bits wide and the digital lower part may be less than or more than 4 bits wide. In an example of FIG. 4, the coarse range 401 may represent a digital upper part of "00", the coarse range 402 may represent a digital upper part of "01", the coarse range 403 may represent a digital upper part of "10", and the coarse range 404 may represent a digital upper part of "11".

A first output voltage $V_{IN\_COL0}$ may correspond to a first analog output of a first output line. A SAR ADC circuit may compare the first output voltage $V_{IN\_COL0}$ to the primary reference voltages. When the first output voltage $V_{IN\_COL0}$ belongs to (or is within) the coarse range 403, as shown in the first box 410 of FIG. 4, the SAR ADC circuit may determine "10" corresponding to the coarse range 403 as an upper part D[5:4] of a first digital output D[5:0] corresponding to the first analog output. The SAR ADC circuit may determine an upper part of a digital output through a binary search. The binary search may be performed the same number of times as a number of bits of the upper part of the digital output. In the example of FIG. 4, when the upper part is 2 bits wide, the binary search may be performed twice to determine the upper part.

For example, the SAR ADC circuit may compare the first output voltage $V_{IN\_COL0}$ to a primary reference voltage corresponding to ½ of the maximum reference voltage $V_{IN\_MAX}$. When the first output voltage $V_{IN\_COL0}$ is greater than or equal to ½ of the maximum reference voltage $V_{IN\_MAX}$ as shown in the first box 410, the SAR ADC circuit may determine a first digital value (for example, an MSB) of the first digital output D[5:0] as "1" and the SAR ADC circuit may compare the first output voltage $V_{IN\_COL0}$ to a primary reference voltage corresponding to ¾ of the maximum reference voltage $V_{IN\_MAX}$. When the first output voltage $V_{IN\_COL0}$ is greater than or equal to ½ and less than ¾ of the maximum reference voltage $V_{IN\_MAX}$ as shown in the first box 410, the SAR ADC circuit may determine a second digital value as "0". When the first output voltage $V_{IN\_COL0}$ is greater than or equal to ¾ of the maximum reference voltage $V_{IN\_MAX}$, the SAR ADC circuit may determine the second digital value as "1".

In another example, when the first output voltage $V_{IN\_COL0}$ is less than ½ of the maximum reference voltage $V_{IN\_MAX}$, the SAR ADC circuit may determine the first digital value (for example, the MSB) of the first digital output D[5:0] as "0" and the SAR ADC circuit may compare the first output voltage $V_{IN\_COL0}$ to a primary reference voltage corresponding to ¼ of the maximum reference voltage $V_{IN\_MAX}$. When the first output voltage $V_{IN\_COL0}$ is less than ¼ of the maximum reference voltage $V_{IN\_MAX}$, the SAR ADC circuit may determine the second digital value as "0". When the first output voltage $V_{IN\_COL0}$ is less than ½ and greater than or equal to ¼ of the maximum reference voltage $V_{IN\_MAX}$, the SAR ADC circuit may determine the second digital value as "1".

Referring to a second box 420, the coarse range 403, and/or primary reference voltages forming the coarse range 403 may constitute or include a maximum voltage $V_{HIGH}$ and a minimum voltage $V_{LOW}$ of secondary reference voltages (e.g., the coarse range 403 may be a range from the minimum voltage $V_{LOW}$ to the maximum voltage $V_{HIGH}$). Also, as shown in a third box 430, secondary reference voltages may be generated based on the maximum voltage $V_{HIGH}$ and the minimum voltage $V_{LOW}$. The secondary reference voltages may form fine ranges of the coarse range 403. When a lower part is Q bits wide, "2^Q" fine ranges may be formed based on "2^Q–1" secondary reference voltages. For example, a 4-bit lower part may be determined through "16" fine ranges. As shown in the third box 430, a flash ADC circuit may determine a lower part D[3:0] as "1001". Based on a combination of the upper part D[5:4] and the lower part D[3:0], the first digital output D[5:0] may be determined as "101001". Accordingly, the flash ADC circuit may determine the lower part D[3:0] similar to how the SAR ADC circuit may determine the upper part D[5:4] in the examples described above.

Figure 5:
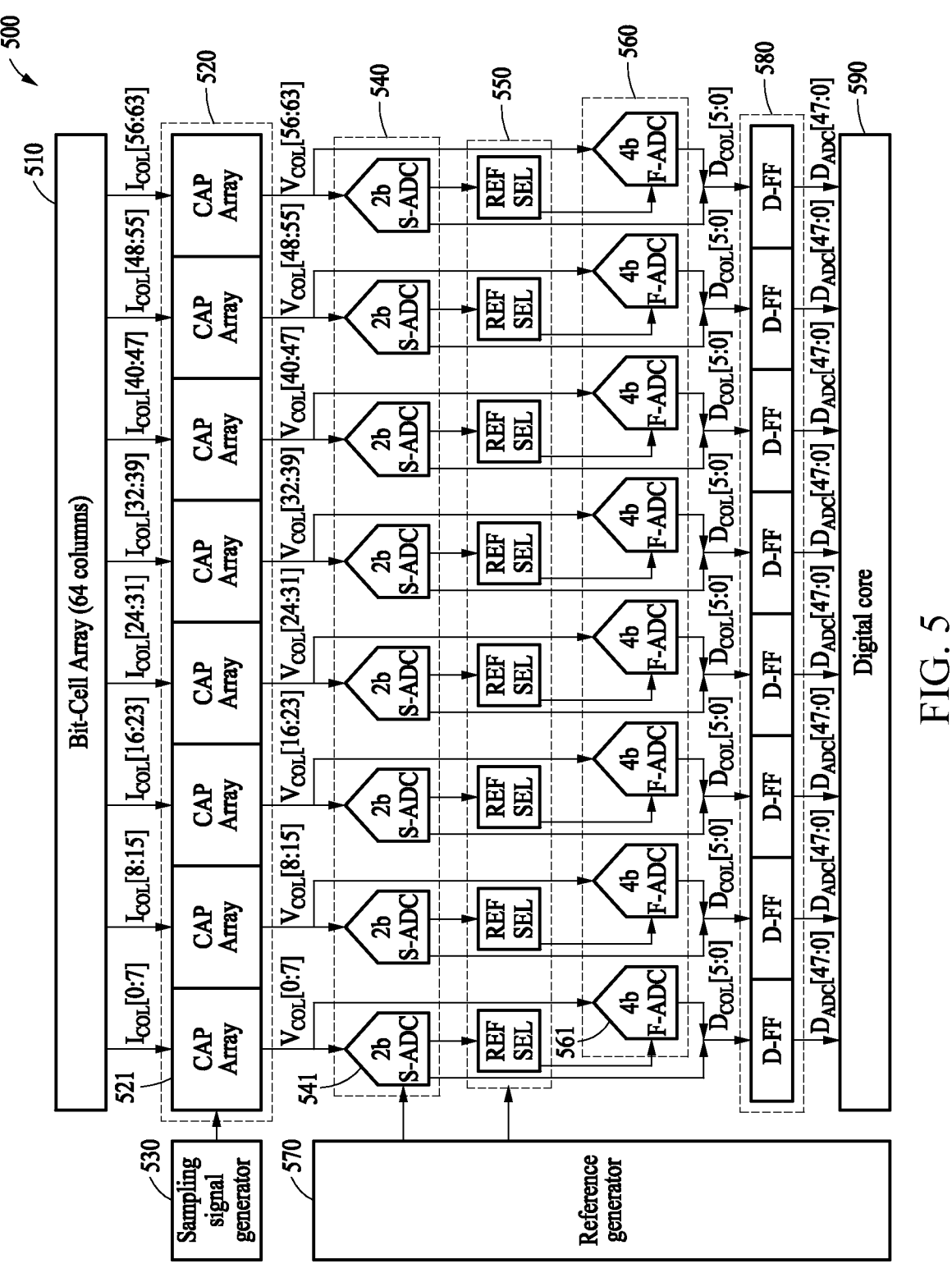
FIG. 5 illustrates an example of a structure of a MAC computation circuit.

FIG. 5 illustrates an example of a structure of a MAC computation circuit. Referring to FIG. 5, a MAC computation circuit 500 may include a bit-cell array 510, a plurality of capacitor arrays 520, a sampling signal generator 530, a plurality of SAR ADC circuits 540, a plurality of reference selectors 550, a plurality of flash ADC circuits 560, a reference generator 570, digital flip-flops 580, and a digital core 590. The bit-cell array 510, the plurality of capacitor arrays 520, and the sampling signal generator 530 may correspond to a MAC operation block, and the plurality of SAR ADC circuits 540, the plurality of reference selector 550, the plurality of flash ADC circuits 560, the reference generator 570, and the digital flip-flops 580 may correspond to an ADC block. Numerical values such as a number of columns of the bit-cell array 510, a number of capacitor arrays 520, or a number of bits of a digital output $D_{COL}[5:0]$ as shown in FIG. 5 are merely a non-limiting example, and other various numerical values may be applicable.

Figure 6:
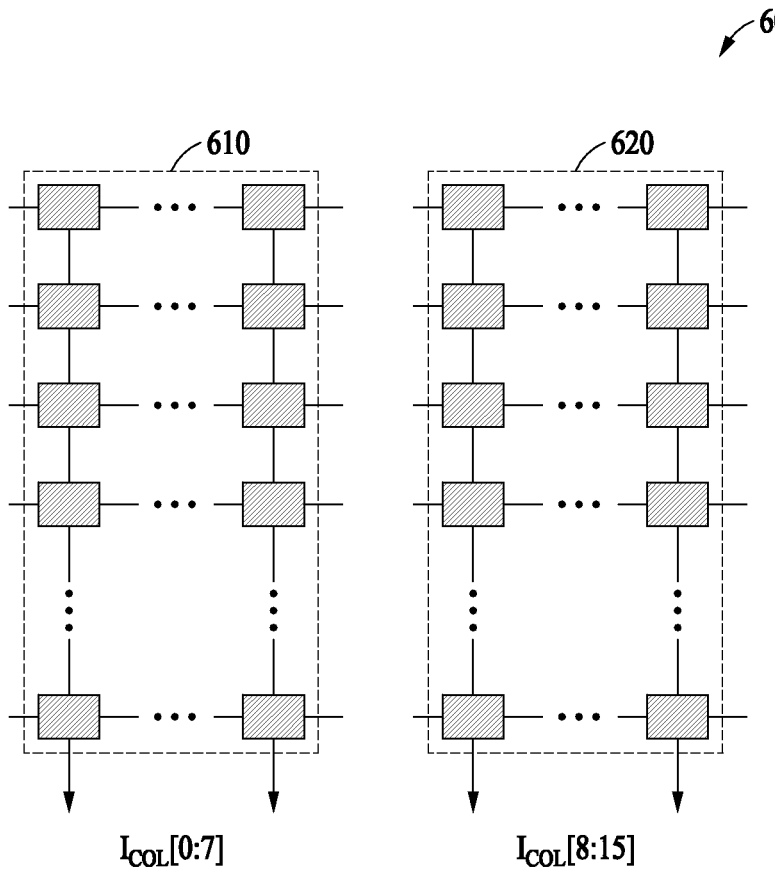
FIG. 6 illustrates an example of bit-cell groups.

The bit-cell array 510 may include a plurality of output lines. In FIG. 5, output lines may be formed by "64" columns. The plurality of output lines may form one bit-cell group. For example, a bit-cell array 600 of FIG. 6 may include a first bit-cell group 610 and a second bit-cell group 620 that each include eight output lines. In this example, the first bit-cell group 610 may output a first output current $I_{COL}[0:7]$, and the second bit-cell group 610 620 may output a second output current $I_{COL}[8:15]$.

Referring back to FIG. 5, each of the plurality of capacitor arrays 520, and each of a plurality of ADC blocks may be assigned to each of a respective one of a plurality of bit-cell groups. For example, one capacitor array and one ADC block may be assigned to one bit-cell group, and a plurality of output lines belonging to the one bit-cell group may share the one capacitor array and the one ADC block assigned to the one bit-cell group. The plurality of capacitor arrays 520 may receive an output current among the total output current $I_{COL}[0:63]$ from a bit-cell group to which the capacitors 520 are assigned. For example, a first capacitor array 521 may receive a first output current $I_{COL}[0:7]$ from a first bit-cell group, and a second capacitor array may receive a second output current $I_{COL}[8:15]$ from a second bit-cell group.

The plurality of capacitor arrays 520 may generate an output voltage $V_{COL}[0:64]$ through sampling based on the output current $I_{COL}[0:63]$ corresponding to an analog output. For example, each of the capacitor arrays 520 may sequentially receive output currents from output lines of a bit-cell group associated with each of the capacitor arrays 520, and may sequentially convert the output currents into output voltages. For example, the first capacitor array 521 may convert the first output current $I_{COL}[0:7]$ into an output voltage $V_{COL}[0:7]$. The plurality of capacitor arrays 520 may sequentially process output currents $I_{COL}[0:63]$ based on a control signal of the sampling signal generator 530.

The plurality of SAR ADC circuits 540 and the plurality of flash ADC circuits 560 may be connected to the plurality of capacitor arrays 520. The plurality of SAR ADC circuits 540 may be referred to as "first ADC circuits" and the plurality of flash ADC circuits 560 may be referred to as "second ADC circuits". The plurality of SAR ADC circuits 540 and the plurality of flash ADC circuits 560 may convert an output voltage $V_{COL}[0:7]$ corresponding to an analog output into a digital output $D_{COL}[5:0]$ based on a bit-cell group. For example, a first SAR ADC circuit 541 and a first flash ADC circuit 561 may generate a digital output $D_{COL}[5:0]$ corresponding to an output voltage $V_{COL}[0]$, a digital output $D_{COL}[5:0]$ corresponding to an output voltage $V_{COL}[1]$, and a digital output $D_{COL}[5:0]$ corresponding to an output voltage $V_{COL}[2]$. The first SAR ADC circuit 541 and the first flash ADC circuit 561 may also generate a digital output $D_{COL}[5:0]$ corresponding to the remaining output voltages $V_{COL}[3:7]$. In this example, the first SAR ADC circuit 541 and the first flash ADC circuit 561 may generate at least a portion of the digital output $D_{COL}[5:0]$ corresponding to the output voltage $V_{COL}[0:7]$ based on a pipeline. A non-limiting example of a pipeline operation will be further described in detail below.

The reference generator 570 may generate a reference voltage, and the reference selector 550 may select the reference voltage. For example, the reference generator 570 may at least partially generate at least a portion of primary reference voltages used by the plurality of SAR ADC circuits 540 and at least a portion of secondary reference voltages used by the plurality of flash ADC circuits 560. When a target range is set by the plurality of SAR ADC circuits 540, the reference selector 550 may select at least a portion of the secondary reference voltages generated by the reference generator 570 and may provide the selected secondary reference voltages to the plurality of flash ADC circuits 560. For example, the reference generator 570 may generate reference voltage candidates for secondary reference voltages, and the reference selector 550 may select at least a portion of the reference voltage candidates corresponding to a digital lower part as secondary reference voltages.

The plurality of SAR ADC circuits 540 may determine an upper part (for example, 2 bits) of a digital output $D_{COL}[5:0]$ based on the output voltage $V_{COL}[0:63]$. The plurality of flash ADC circuits 560 may determine a lower part (for example, 4 bits) of the digital output $D_{COL}[5:0]$ based on the output voltage $V_{COL}[0:63]$ and the secondary reference voltages. Digital outputs $D_{COL}[5:0]$ may be stored in the digital flip-flops 580 and may be combined to digital outputs $D_{ADC}[47:0]$, to be provided to the digital core 590.

Figure 7:
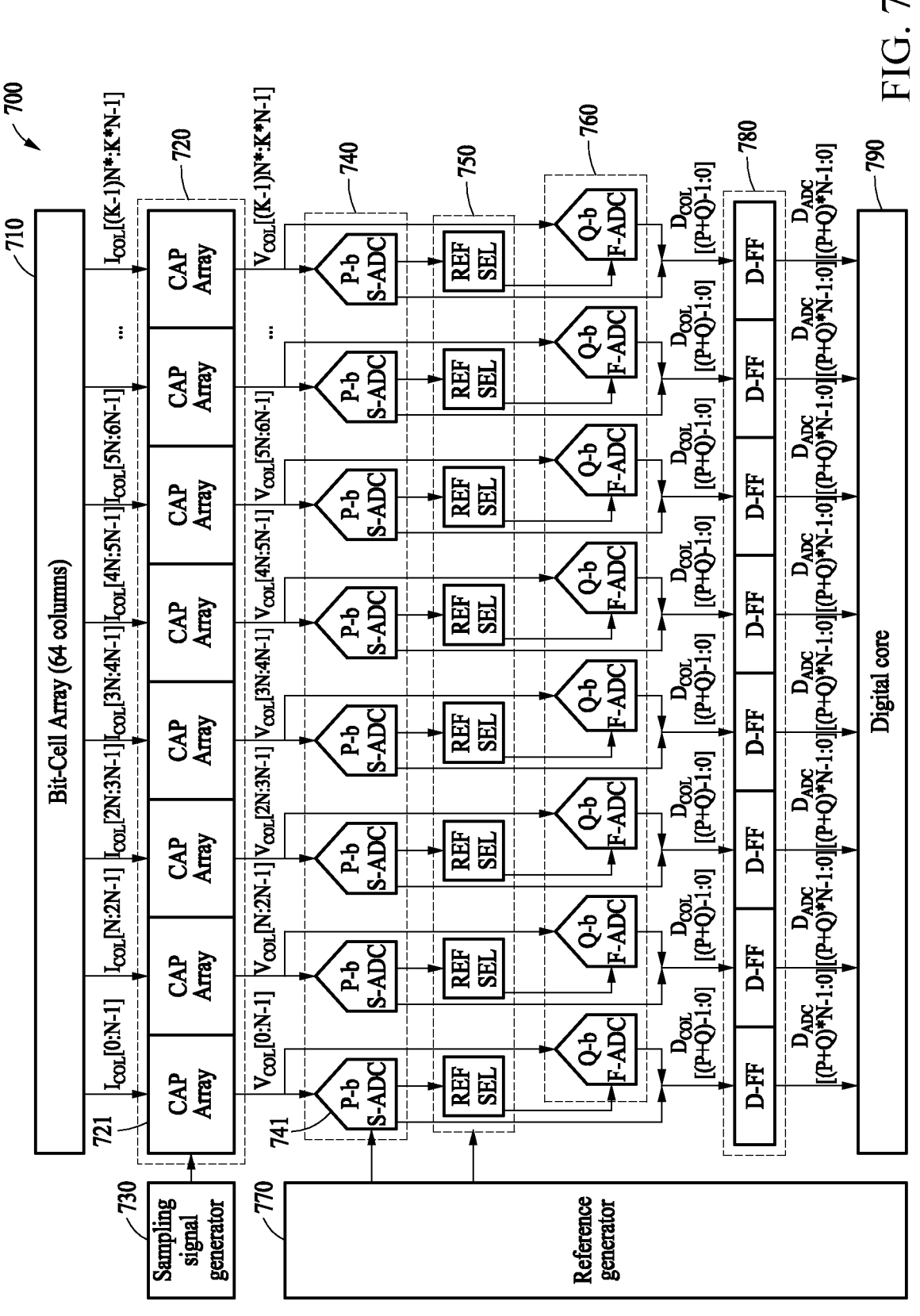
FIG. 7 illustrates an example of a structure of a MAC computation circuit.

FIG. 7 illustrates an example of a structure of a MAC computation circuit. Referring to FIG. 7, a MAC computation circuit 700 may include a bit-cell array 710, a plurality of capacitor arrays 720 (including a first capacitor array 721), a sampling signal generator 730, a plurality of SAR ADC circuits 740 (including a first SAR ADC circuit 741), a plurality of reference selectors 750, a plurality of flash ADC circuits 760, a reference generator 770, digital flip-flops 780, and a digital core 790. Unlike the MAC computation circuit 500 of FIG. 5, an arbitrary numerical value may be applied to the MAC computation circuit 700 of FIG. 7. For example, the bit-cell array 710 may be divided into "K" bit-cell groups that each may include "N" output lines, i.e., columns. The plurality of SAR ADC circuits 740 may determine high-order P bits of a digital output $D_{COL}[(P+Q)-1:0]$, and the plurality of flash ADC circuits 760 may determine low-order Q bits of the digital output $D_{COL}[(P+Q)-1:0]$. Also, the description of FIG. 5 may apply to the MAC computation circuit 700.

Figure 8:
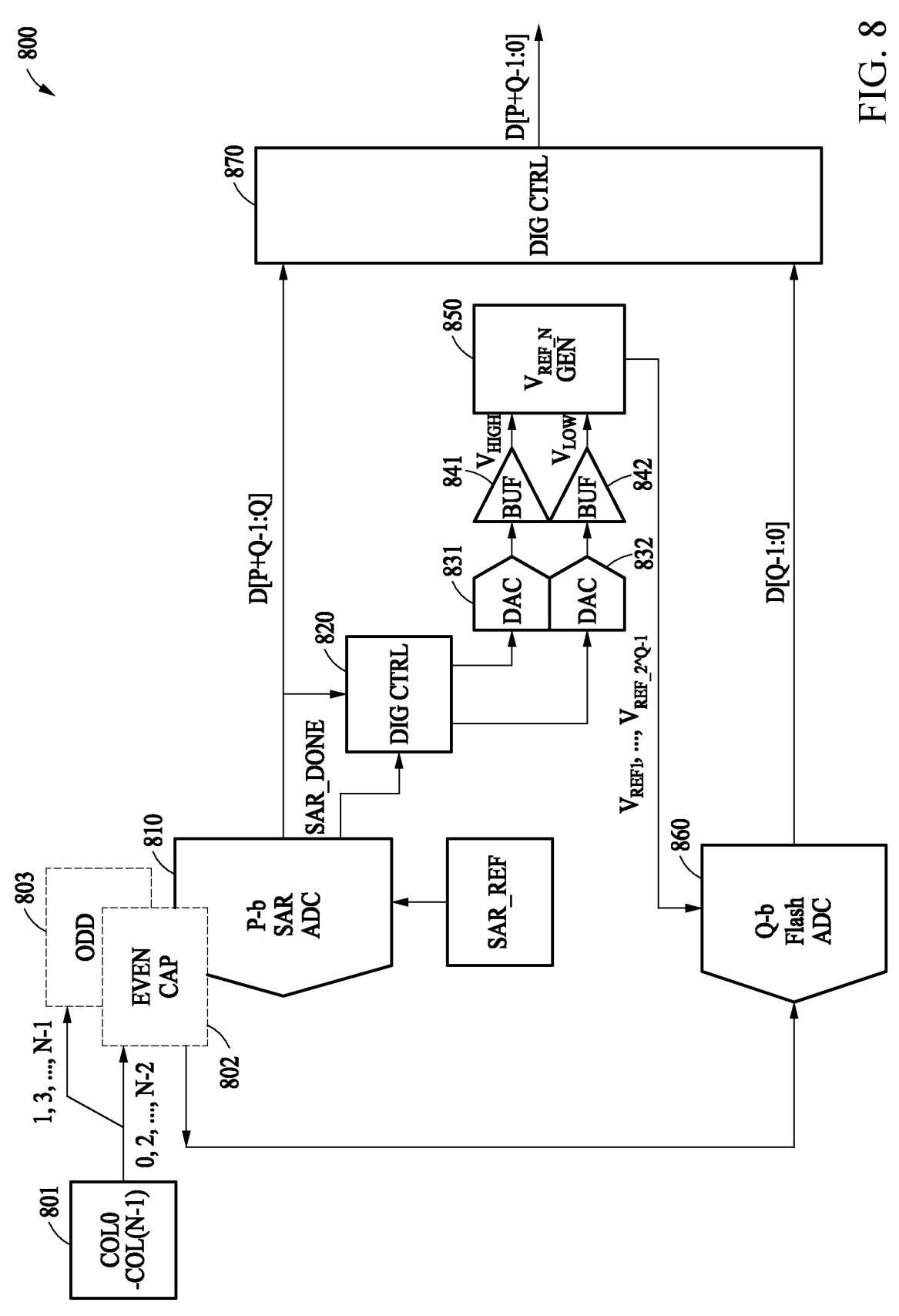
FIG. 8 illustrates an example of a hybrid ADC structure using two capacitors.

FIG. 8 illustrates an example of a hybrid ADC structure (of a MAC computation circuit 800, for example) using two capacitors. Referring to FIG. 8, when output signals COL0 to COL(N−1) are output from a bit-cell array 801, an even-numbered capacitor 802 and an odd-numbered capacitor 803 may sequentially sample the output signals COL0 to COL(N−1). The output signals COL0 to COL(N−1) may correspond to an output current of each output line of the bit-cell array 801. The even-numbered capacitor 802 may sample even-numbered output signals, for example, COL0, COL2, and COL(N−2), corresponding to outputs of output lines of a first sub-group. The odd-numbered capacitor 803 may sample odd-numbered output signals, for example, COL1, COL3, and COL(N−1), corresponding to outputs of output lines of a second sub-group.

A SAR ADC circuit 810 and a flash ADC circuit 860 may convert a sampling result (for example, analog voltage values) into a digital output D. The SAR ADC circuit 810 may determine high-order P bits of the digital output D, and the flash ADC circuit 860 may determine low-order Q bits of the digital output D. The SAR ADC circuit 810 may determine a digital output D[P+Q−1:Q]corresponding to the sampling result based on a reference SAR_REF. For example, the SAR ADC circuit 810 may determine the digital output D[P+Q−1:Q] based on a binary search that is performed "P" times. The reference SAR_REF may include one or more primary reference voltages. For example, the reference SAR_REF may include the maximum reference voltage $V_{IN\_MAX}$ of FIG. 4, or all primary reference voltages of the first box 410. When the digital output D[P+Q−1:Q] is determined, the SAR ADC circuit 810 may output a completion signal SAR_DONE.

A first digital controller 820 may transmit the digital output D[P+Q−1:Q] to digital-to-analog conversion (DAC) circuits 831 and 832, in response to the completion signal SAR_DONE. The DAC circuits 831 and 832 and buffers 841 and 842 may convert the digital output D[P+Q−1:Q] into analog voltages $V_{HIGH}$ and $V_{LOW}$. The DAC circuit 831 and the buffer 841 may determine a relatively high analog voltage $V_{HIGH}$, and the DAC circuit 832 and the buffer 842 may determine a relatively low analog voltage $V_{LOW}$. A reference voltage generator 850 may generate reference voltages $V_{REF1}$ to $V_{REF\_2^{\wedge}Q-1}$ based on the analog voltages $V_{HIGH}$ and $V_{LOW}$. A flash ADC circuit 860 may determine a digital output D[Q−1:0] corresponding to a sampling result based on the reference voltages $V_{REF1}$ to $V_{REF\_2^{\wedge}Q-1}$. A second digital controller 870 may output a digital output D[P+Q−1:0] by combining the digital output D[P+Q−1:Q] of the SAR ADC circuit 810 and the digital output D[Q−1:0] of the flash ADC circuit 860.

Figure 9:
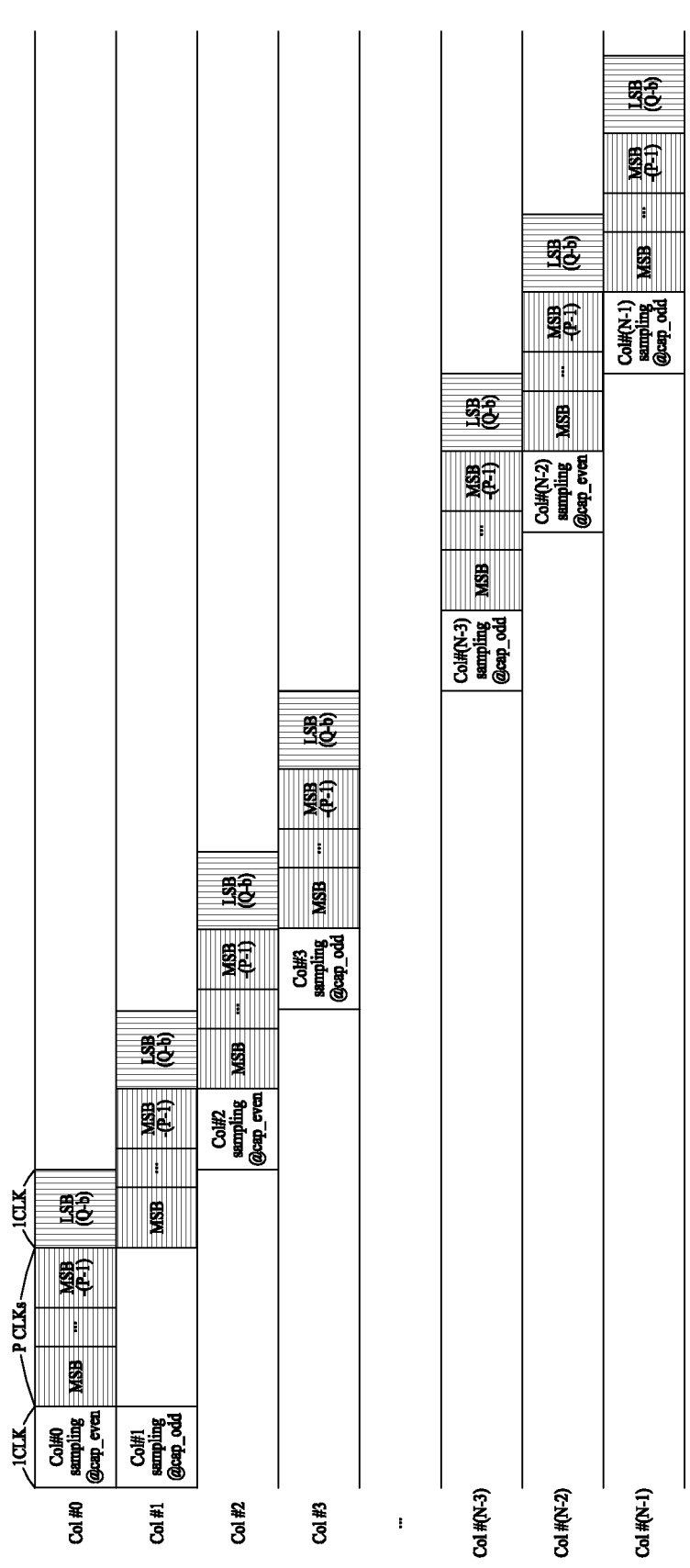
FIG. 9 illustrates an example of a pipeline operation using two capacitors.

The SAR ADC circuit 810 and the flash ADC circuit 860 may operate based on a pipeline using the even-numbered capacitor 802 and the odd-numbered capacitor 803. A non-limiting example of a pipeline operation will be further described with reference to FIG. 9. FIG. 9 illustrates an example of a pipeline operation using two capacitors. In FIG. 9, a white block represents a sampling operation of a capacitor, a horizontal stripe block represents a conversion operation of a SAR ADC circuit, and a vertical strip block represents a conversion operation of a flash ADC circuit. Referring to FIG. 9, an even-numbered capacitor may sample an output of a first column Col #0 at a first clock, and an odd-numbered capacitor may sample an output of a second column Col #1 at the same clock, i.e., the first clock. In an initial operation, the even-numbered capacitor and the odd-numbered capacitor may operate together. In a subsequent operation, the even-numbered capacitor and the odd-numbered capacitor may sequentially operate according to the pipeline.

The SAR ADC circuit may determine an upper digital value of a sampling result during P clocks from a next clock, i.e., a second clock, and the flash ADC circuit may determine a lower digital value of the sampling result during next one clock, i.e., a (P+2)-th clock. The SAR ADC circuit may perform a binary search, and P clocks may be used to determine a P-bit digital value. The flash ADC circuit may determine a Q-bit digital value during one clock using a plurality of reference voltages. The flash ADC circuit may perform a conversion operation on the first column Col #0 during the (P+2)-th clock, and the SAR ADC circuit may perform a conversion operation on the second column Col #1 for a predetermined interval from the (P+2)-th clock. When the conversion operation on the first column Col #0 is completed by the flash ADC circuit, the even-numbered capacitor may sample an output of a third column Col #2.

Capacitors and ADC circuits may perform the above conversion operations up to an N-th column Col #(N−1), and a conversion efficiency may be enhanced through the pipeline operation. A time interval in which operations of the capacitors and the ADC circuits overlap each other may have an influence on an increase in a conversion efficiency. For example, the SAR ADC circuit may determine a digital upper part of an output of an output line (for example, the first column Col #0) of a first sub-group for a first time interval (for example, the P clocks from the second clock). The flash ADC circuit may determine a digital lower part of the output of the output line (for example, the first column Col #0) of the first sub-group for a second time interval (for example, one clock, i.e., the (P+2)-th clock). Also, the SAR ADC circuit may determine a digital upper part of an output of an output line (for example, the second column Col #1) of a second sub-group for a third time interval (for example, P clocks from the (P+2)-th clock). In this example, at least a portion of the third time interval may overlap the second time interval according to the pipeline, and thus the conversion efficiency may be enhanced. In addition, although an example in which capacitors are classified into an even-numbered capacitor and an odd-numbered capacitor has been described above, the capacitors may be classified according to other criteria such as a large number and a small number, and at least three capacitors may also be used.

Figure 10:
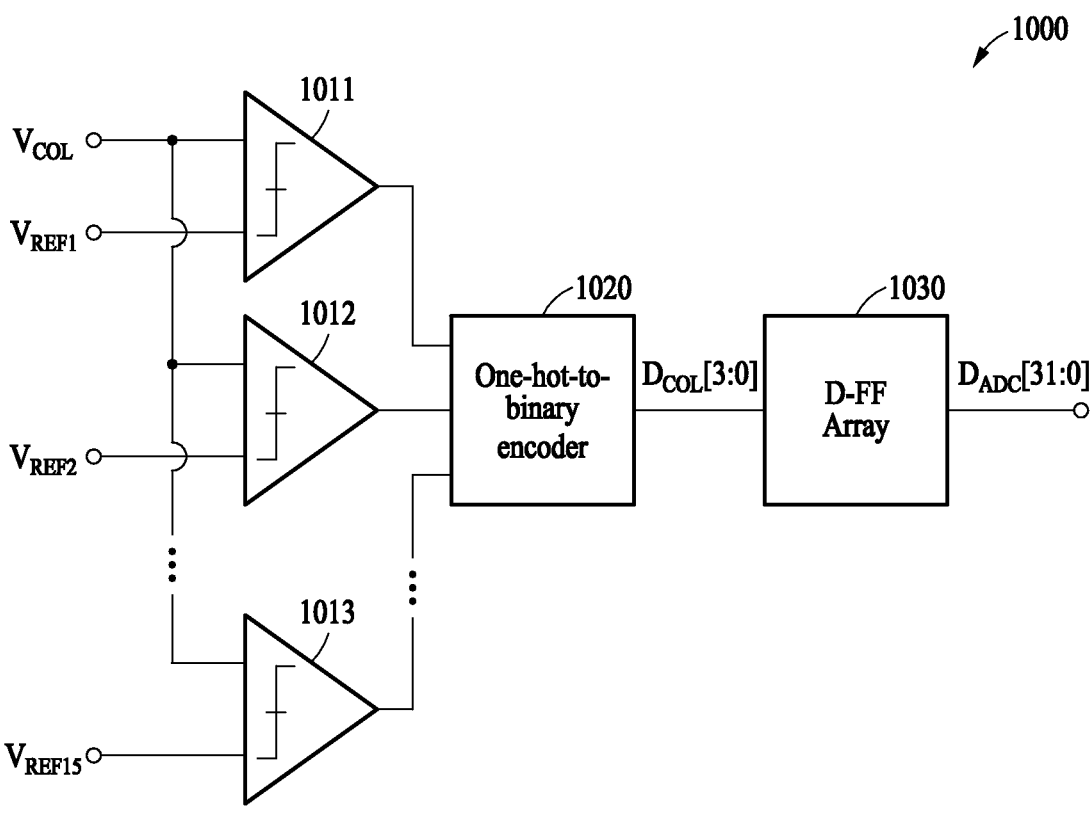
FIG. 10 illustrates an example of a flash ADC circuit.

FIG. 10 illustrates an example of a flash ADC circuit. Referring to FIG. 10, a flash ADC circuit 1000 may include a plurality of comparators 1011 to 1013 (for example, "15" comparators), a one-hot-to-binary encoder 1020, and a digital flip-flop array 1030. The plurality of comparators 1011 to 1013 may compare an output voltage $V_{COL}$ to reference voltages $V_{REF1}$ to $V_{REF15}$, and may output comparison results. When a number of bits of a digital value determined by the flash ADC circuit 1000 is "Q", "$2^{\wedge}Q-1$" comparators may be used. The comparators 1011 to 1013 may determine a 4-bit digital value. The one-hot-to-binary encoder 1020 may output a digital output $D_{COL}[3:0]$ corresponding to the comparison results, and the digital flip-flop array 1030 may output a digital output $D_{ADC}[31:0]$ by merging digital outputs $D_{COL}[3:0]$ of a plurality of output lines (for example, eight output lines). When the "$2^{\wedge}Q-1$" comparators are used for Q-bit conversion, a number of comparators may exponentially increase by adding comparators to the flash ADC circuit 1000 for an increase in a bit precision, which may result in a great increase in an area and power consumption of the flash ADC circuit 1000. Hybrid-type ADC circuits according to examples may enhance a bit precision while minimizing areas and power consumption thereof.

Figure 11:
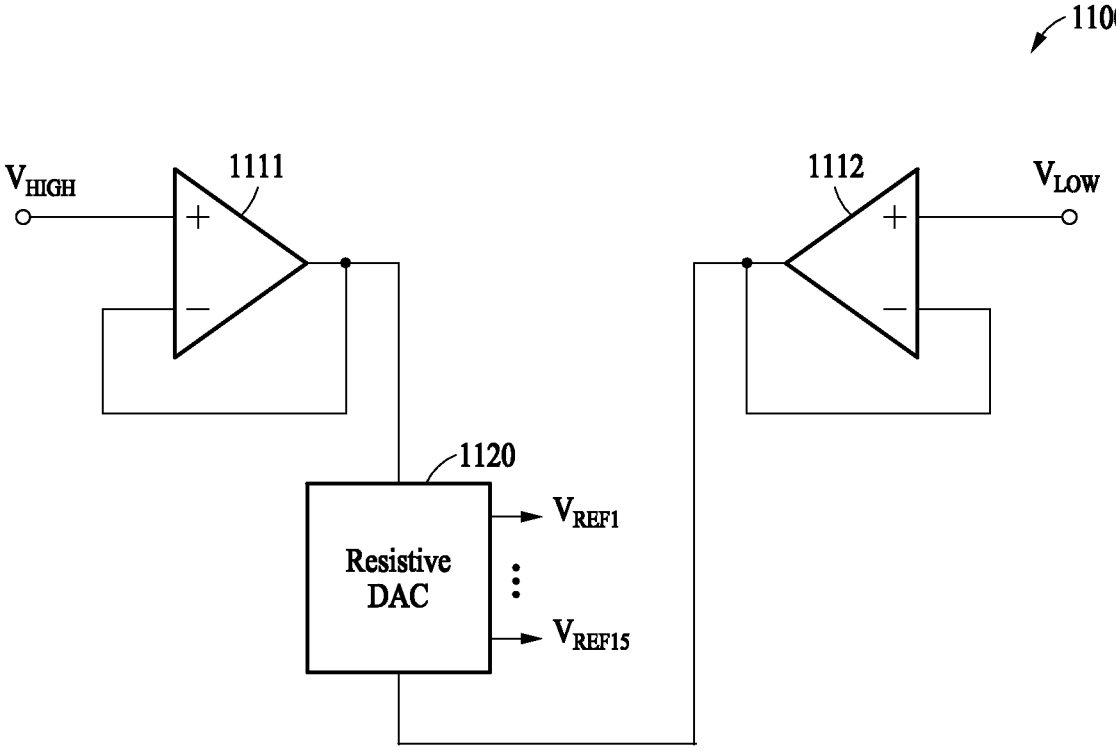
FIG. 11 illustrates an example of a reference generator.
Figure 12:
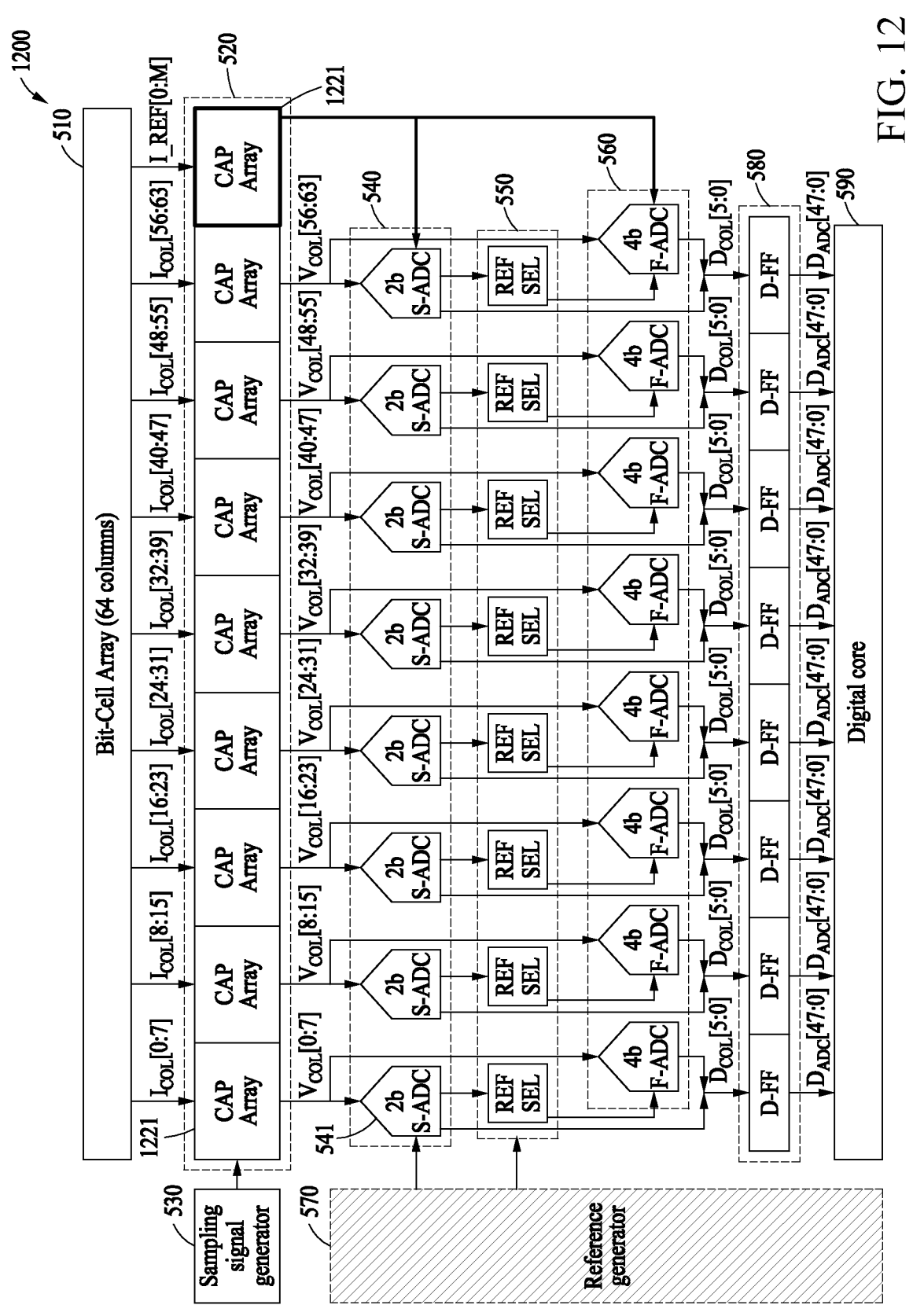
FIG. 12 illustrates an example of a structure for generating a reference using an analog output.

FIG. 11 illustrates an example of a reference generator, and FIG. 12 illustrates an example of a structure for generating a reference using an analog output. Referring to FIG. 11, a reference generator 1100 may include amplifiers 1111 and 1112, and a resistive DAC 1120. The amplifiers 1111 and 1112 and the resistive DAC 1120 may generate reference voltages $V_{REF1}$ to $V_{REF15}$ by equally dividing a voltage range between a high reference voltage $V_{HIGH}$ and a low reference voltage $V_{LOW}$.

Referring to FIG. 12, a MAC computation circuit 1200 may include input/output lines and a capacitor array 1221 instead of the reference generator 570. The bit-cell array 510 may further output a reference current $I_{REF}$[0:M] in addition to an output current $I_{COL}$[0:63], and the reference current $I_{REF}$[0:M] may be provided to the capacitor array 1221. "M−1" may represent a number of required reference voltages. For example, any one or any combination of a maximum reference voltage $V_{IN\_MAX}$ and voltages corresponding to ¼, 2/4 and ¾ of the maximum reference voltage $V_{IN\_MAX}$ may be used as a primary reference voltage, and one or more of various voltage values forming fine ranges of each coarse range may be used as a secondary reference voltage. The bit-cell array 510 may have an internal structure to provide a reference current corresponding to at least a portion of the above necessary reference voltages, and accordingly the reference current may be provided. The capacitor array 1221 may generate reference voltages based on the reference current $I_{REF}$[0:M]. The reference voltages may be provided to the SAR ADC circuits 540 and/or the flash ADC circuits 560.

Figure 13:
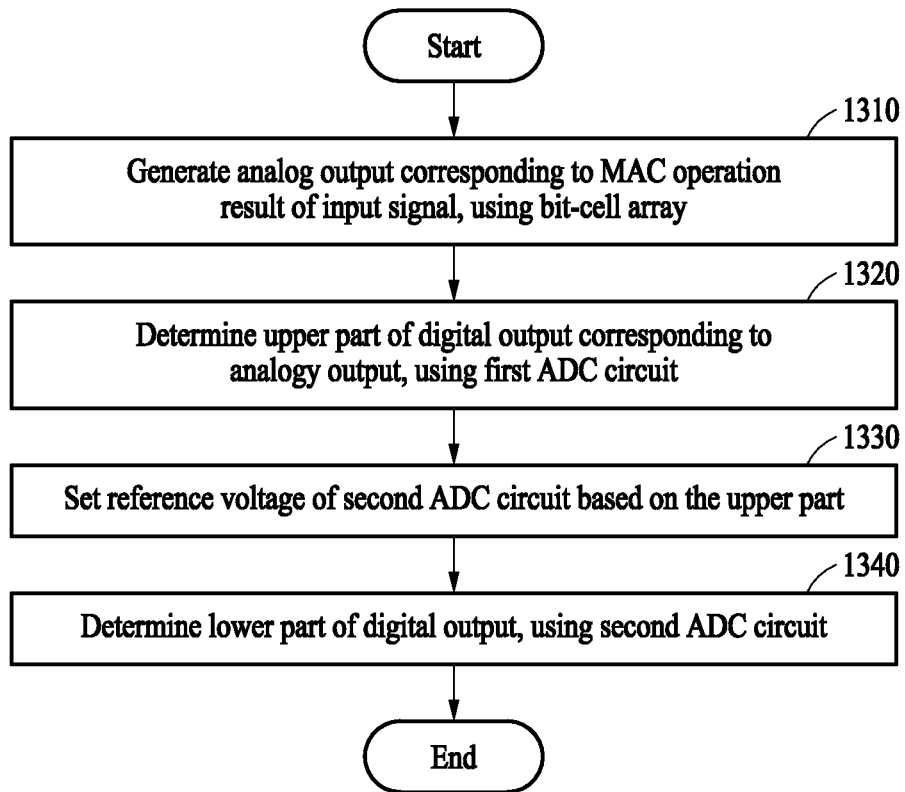
FIG. 13 illustrates an example of a computing operation.

FIG. 13 illustrates an example of a computing operation. Referring to FIG. 13, in operation 1310, an analog output corresponding to a MAC operation result of an input signal may be generated using a bit-cell array. In operation 1320, an upper part of a digital output corresponding to the analog output may be determined using a first ADC circuit. In operation 1330, a reference voltage of a second ADC circuit may be set based on the upper part. In operation 1340, a lower part of the digital output may be determined using the second ADC circuit. Operations 1310 to 1340 may be sequentially or non-sequentially performed. For example, the order of operations 1310 to 1340 may be changed, and/or at least two of operations 1310 to 1340 may be performed in parallel. Operations 1310 to 1340 may be performed by, for example, one or more of components of the MAC computation circuits 100, 500, 700, and 1200. In addition, the above description of FIGS. 1 to 12, and description of FIGS. 14 and 15 that will be provided below may apply to the computing operation.

Figure 14:
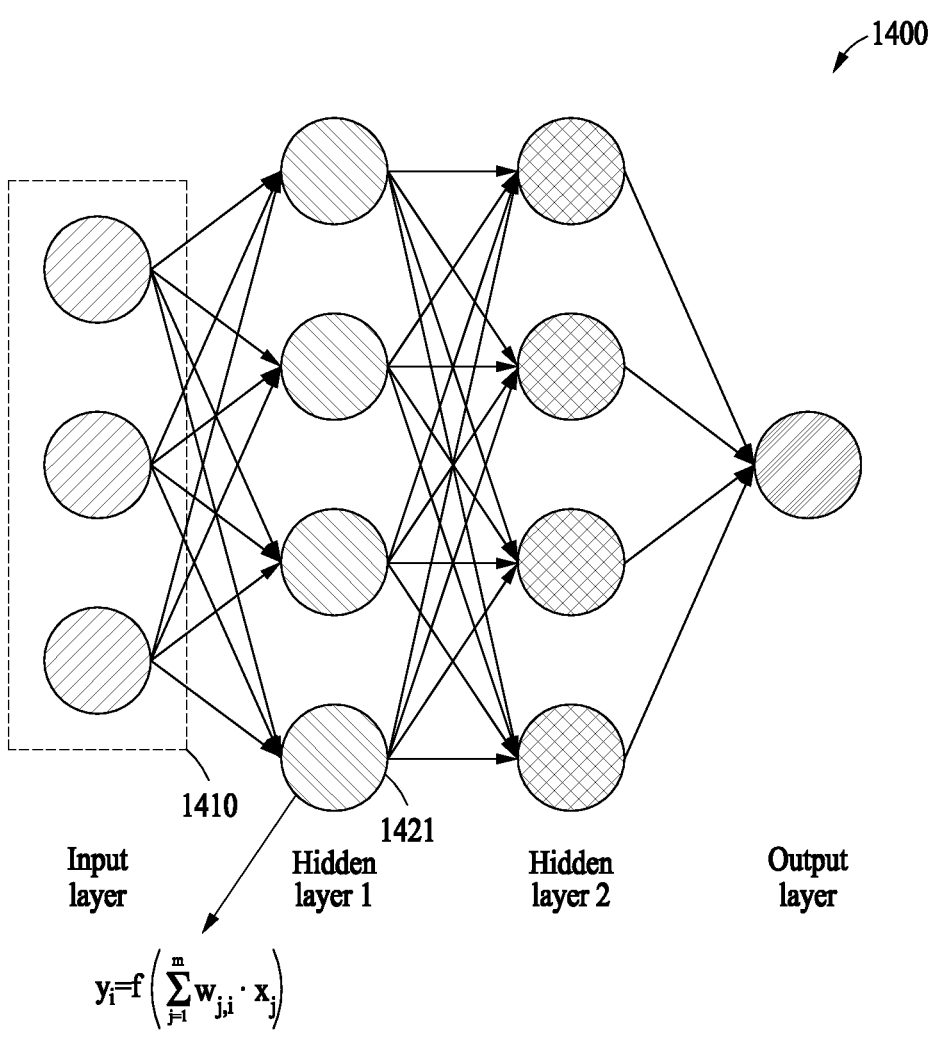
FIG. 14 illustrates an example of a neural network operation that may be implemented by a MAC computation circuit.

FIG. 14 illustrates an example of a neural network operation that may be implemented by a MAC computation circuit. A neural network 1400 may correspond to an example of a deep neural network (DNN). The DNN may include, for example, a fully connected network, a deep convolutional network, and a recurrent neural network. The neural network 1400 may map input data and output data that are in a nonlinear relationship based on deep learning, to perform, for example, object classification, object recognition, speech recognition, or image recognition. Deep learning, which is a machine learning scheme used to solve an issue such as image or speech recognition from a big data set, may map input data and output data to each other through supervised or unsupervised learning.

Although a hidden layer includes two layers as shown in FIG. 14 for convenience of description, the hidden layer may include various numbers of layers. Also, although the neural network 1400 includes a separate input layer 1410 to receive input data as shown in FIG. 14, the input data may be input directly to a hidden layer. In the neural network 1400, artificial nodes of layers other than an output layer may be connected to artificial nodes of a next layer through links for transmitting output signals. A number of links may correspond to a number of artificial nodes included in the next layer.

To each artificial node included in the hidden layer, outputs of artificial nodes included in a previous layer may be input in a weighted form. Such an input in the weighted form may be called a "weighted input" and may be obtained by multiplying a respective weight by outputs of artificial nodes included in the previous layer. A weight may also be referred to as a parameter of the neural network 1400. An activation function may be applied to a sum of weighted inputs to be output to a next layer. The activation function may include, for example, sigmoid, hyperbolic tangent (tanh), or rectified linear unit (ReLU). By the activation function, nonlinearity of the neural network 1400 may be formed. To each artificial node included in the output layer, weighted inputs of outputs of artificial nodes included in a previous layer may be input.

For in-memory computing for driving a deep learning algorithm, the MAC computation circuits 100, 500, 700, and 1200 described above with reference to FIGS. 1 to 13 may be used. For example, calculation of a weight input transferred between nodes 1421 of the neural network 1400 may include a MAC operation that repeats a multiplication and an addition. An output of one node 1421 of the neural network 1400 may be represented as shown in the following equation:

$$y_i = f\left( \sum_{j=1}^{m} w_{j,i} x_j \right)$$

The equation may represent an output value $y_i$ of an i-th node 1421 for "m" weighted input values in one layer. $x_j$ denotes a j-th output value (for example, a node value) of a previous layer, and $w_{j,i}$ denotes a weight applied to the j-th output value of the previous layer and the i-th node 1421. Also, $w_{j,i} x_j$ denotes a j-th weighted input among the "m" weighted input values in an i-th node 1421 of a corresponding node, and f( ) denotes an activation function. As shown in the above equation, for the activation function, a multiplication and accumulation result of the node value $x_j$ and the weight $w_{j,i}$ may be used. In other words, a memory access operation that requires loading of an appropriate node value $x_j$ and weight $w_{j,i}$ at a desired time, and a MAC operation of multiplying and adding the node value $x_j$ and weight $w_{j,i}$ may be repeated.

In an example, bit cells of a MAC computation circuit may have a resistance corresponding to a connection weight of a connection line used to connect a plurality of nodes in the neural network 1400 that includes a layer including the plurality of nodes. An input voltage signal provided along input lines on which a plurality of bit cells are arranged may represent a value corresponding to the node value $x_j$. Thus, the MAC computation circuit may perform at least a portion of operations required for execution of the neural network 1400. In the MAC computation circuit, resistance values of the bit cells may not be fixed, and may also be changed to a resistance value corresponding to a weight value stored in a memory as described above.

However, an application of the MAC computation circuit is not limited thereto, and the MAC computation circuit may also be utilized for a computation operation that requires fast processing of a plurality of pieces of input data with low power using analog circuit characteristics.

Figure 15:
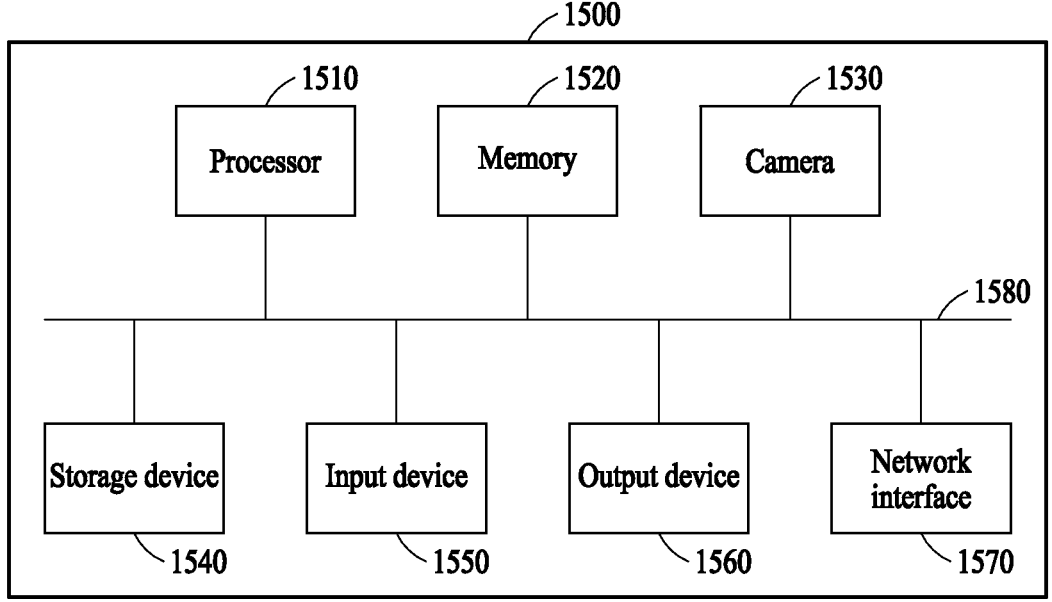
FIG. 15 illustrates an example of an electronic apparatus.

FIG. 15 illustrates an example of an electronic apparatus. Referring to FIG. 15, an electronic apparatus 1500 may include a processor 1510 (e.g., one or more processors), a memory 1520 (e.g., one or more memories), a camera 1530, a storage device 1540, an input device 1550, an output device 1560, and a network interface 1570. The processor 1510, the memory 1520, the camera 1530, the storage device 1540, the input device 1550, the output device 1560, and the network interface 1570 may communicate with each other via a communication bus 1580. For example, the electronic apparatus 1500 may be implemented as at least a portion of, for example, a mobile device such as a mobile phone, a smartphone, a personal digital assistant (PDA), a netbook, a tablet computer or a laptop computer, a wearable device such as a smartwatch, a smart band or smart glasses, a computing device such as a desktop or a server, home appliances such as a television (TV), a smart TV or a refrigerator, a security device such as a door lock, or a vehicle such as an autonomous vehicle or a smart vehicle. The electronic apparatus 1500 may structurally and/or functionally include the MAC computation circuits 100, 500, 700 and 1200. For example, the MAC computation circuits 100, 500, 700 and 1200 may be implemented as a portion of the processor 1510 and/or the memory 1520, or as a portion of an accelerator of the electronic apparatus 1500.

The processor 1510 may execute instructions and functions in the electronic apparatus 1500. For example, the processor 1510 may process instructions stored in the memory 1520 or the storage device 1540. The processor 1510 may perform any or all of the operations described above with reference to FIGS. 1 through 14. The memory 1520 may include a non-transitory computer-readable storage medium or a non-transitory computer-readable storage device. The memory 1520 may store instructions that are to be executed by the processor 1510, and may also store information associated with software and/or applications when the software and/or applications are being executed by the electronic apparatus 1500.

The camera 1530 may capture a photo and/or a video. The storage device 1540 may include a non-transitory computer-readable storage medium or a non-transitory computer-readable storage device. In an example, the storage device 1540 may store a greater amount of information than that of the memory 1520 for a relatively long period of time. For example, the storage device 1540 may include magnetic hard disks, optical disks, flash memories, floppy disks, or other forms of non-volatile memories known in the art.

The input device 1550 may receive an input from a user through a traditional input scheme using a keyboard and a mouse, and through a new input scheme such as a touch input, a voice input and an image input. The input device 1550 may include, for example, a keyboard, a mouse, a touch screen, a microphone, or other devices configured to detect an input from a user and transmit the detected input to the electronic apparatus 1500. The output device 1560 may provide a user with an output of the electronic apparatus 1500 through a visual channel, an auditory channel, or a tactile channel. The output device 1560 may include, for example, a display, a touchscreen, a speaker, a vibration generator, or any other device configured to provide a user with the output. The network interface 1570 may communicate with an external device via a wired or wireless network.

The MAC computation circuits, bit-cell arrays, capacitor arrays, ADC blocks, first ADC circuits, second ADC circuits, output lines, bit cells, AR ADC circuits, reference generators, flash ADC circuits, first capacitor arrays, sampling signal generators, SAR ADC circuits, first SAR ADC circuits, reference selectors, digital flip-flops, digital cores, first bit-cell groups, second bit-cell groups, even-numbered capacitors, odd-numbered capacitors, first digital controllers, DAC circuits, buffers, reference voltage generators, second digital controllers, comparators, one-hot-to-binary encoders, digital flip-flop arrays, amplifiers, resistive DACs, electronic apparatuses, processors, memories, cameras, storage devices, input devices, output devices, network interfaces, communication buses, MAC computation circuit 100, bit-cell array 111, capacitor array 112, ADC block 120, first ADC circuit 121, second ADC circuit 122, bit-cell array 290, output line 292, bit cell 210, ADC block 300, AR ADC circuit 310, reference generator 320, flash ADC circuit 330, MAC computation circuit 500, bit-cell array 510, capacitor arrays 520, first capacitor array 521, sampling signal generator 530, SAR ADC circuits 540, first SAR ADC circuit 541, reference selectors 550, flash ADC circuits 560, reference generator 570, digital flip-flops 580, digital core 590, bit-cell array 600, first bit-cell group 610, second bit-cell group 620, MAC computation circuit 700, bit-cell array 710, capacitor arrays 720, first capacitor array 721, sampling signal generator 730, SAR ADC circuits 740, first SAR ADC circuit 741, reference selectors 750, flash ADC circuits 760, reference generator 770, digital flip-flops 780, digital core 790, MAC computation circuit 800, bit-cell array 801, even-numbered capacitor 802, odd-numbered capacitor 803, SAR ADC circuit 810, first digital controller 820, DAC circuits 831 and 832, buffers 841 and 842, reference voltage generator 850, flash ADC circuit 860, second digital controller 870, flash ADC circuit 1000, comparators 1011 to 1013, one-hot-to-binary encoder 1020, digital flip-flop array 1030, reference generator 1100, amplifiers 1111 and 1112, resistive DAC 1120, MAC computation circuit 1200, capacitor array 1221, electronic apparatus 1500, processor 1510, memory 1520, camera 1530, storage device 1540, input device 1550, output device 1560, network interface 1570, communication bus 1580, and other apparatuses, devices, units, modules, and components described herein with respect to FIGS. 1-15 are implemented by or representative of hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-15 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EE-PROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

What is claimed is:

1. A multiply-accumulate (MAC) computation circuit comprising:
   a bit-cell array configured to generate an analog output corresponding to a MAC operation result of an input signal;
   a capacitor array configured to convert a current value of the analog output into a voltage value;
   a first analog-to-digital conversion (ADC) circuit configured to receive the voltage value of the analog output and determine an upper part of a digital output corresponding to the analog output; and
   a second ADC circuit configured to receive the voltage value of the analog output and determine a lower part of the digital output based on a reference voltage corresponding to the upper part, wherein the first ADC circuit is a successive approximation register (SAR) ADC circuit, and the second ADC circuit is a flash ADC circuit.

2. The MAC computation circuit of claim 1, wherein for the determining of the upper part, the first ADC circuit is configured to compare the analog output to coarse ranges according to primary reference voltages and determine a first range to which the analog output belongs among the coarse ranges, and the first range corresponds to the upper part of the digital output.

3. The MAC computation circuit of claim 2, wherein for the determining of the lower part, the second ADC circuit is configured to compare the analog output to fine ranges of the first range according to secondary reference voltages including the reference voltage and determine a second range to which the analog output belongs among the fine ranges, and the second range corresponds to the lower part of the digital output.

4. The MAC computation circuit of claim 2, wherein the primary reference voltages are set based on the analog output.

5. The MAC computation circuit of claim 1, wherein the digital output is 6 bits wide, the upper part is 2 bits wide, and the lower part is 4 bits wide.

6. The MAC computation circuit of claim 1, wherein the bit-cell array comprises a plurality of input lines and a plurality of output lines, and a first analog output of a first output line among the plurality of output lines corresponds to a result of a first MAC operation performed between voltage values applied to the first output line by the input signal and resistance values of bit-cells belonging to the first output line.

7. The MAC computation circuit of claim 1, wherein the bit-cell array comprises a plurality of bit-cell groups that each comprise a plurality of output lines, and first output lines belonging to a first bit-cell group among the plurality of bit-cell groups share a first ADC block and a first capacitor array assigned to the first bit-cell group.

8. The MAC computation circuit of claim 7, wherein the first capacitor array comprises:

a first capacitor configured to sample outputs of output lines of a first sub-group among the first output lines; and a second capacitor configured to sample outputs of output lines of a second sub-group among the first output lines.

9. The MAC computation circuit of claim 8, wherein the first ADC block comprises the first ADC circuit and the second ADC circuit, and the first ADC circuit and the second ADC circuit operate based on a pipeline.

10. The MAC computation circuit of claim 9, wherein the first ADC circuit is configured to determine a digital upper part of an output of an output line of the first sub-group for a first time interval, the second ADC circuit is configured to determine a digital lower part of the output of the output line of the first sub-group for a second time interval, the first ADC circuit is configured to determine a digital upper part of an output of an output line of the second sub-group for a third time interval, and at least a portion of the third time interval overlaps the second time interval according to the pipeline.

11. The MAC computation circuit of claim 8, wherein an even-numbered output line among the first output lines belongs to the first sub-group, and an odd-numbered output line among the first output lines belongs to the second sub-group.

12. The MAC computation circuit of claim 1, further comprising a plurality of capacitor arrays comprising the capacitor array and configured to sample the analog output, a plurality of first ADC circuits comprising the first ADC circuit, and a plurality of second ADC circuits comprising the second ADC circuit.

13. An electronic apparatus comprising the MAC computation circuit of claim 1 and a processor configured to generate a recognition result of an input corresponding to the input signal, based on the digital output.

14. A multiply-accumulate (MAC) computation circuit comprising:

a bit-cell array configured to generate an analog output corresponding to a MAC operation result of an input signal, using a plurality of bit-cell groups, each comprising a plurality of output lines;

a plurality of capacitor arrays configured to sample the analog output by converting a current value of the analog output into a voltage value, the plurality of capacitor arrays being assigned to each of the plurality of bit-cell groups;

a plurality of first analog-to-digital conversion (ADC) circuits configured to receive the voltage value of the analog output and determine an upper part of a digital output corresponding to the analog output, the plurality of first ADC circuits being connected to the plurality of capacitor arrays; and a plurality of second ADC circuits configured to receive the voltage value of the analog output and determine a lower part of the digital output based on a reference voltage corresponding to the upper part, wherein the plurality of first ADC circuits are successive approximation register (SAR) ADC circuits, and the plurality of second ADC circuits are flash ADC circuits.

15. The MAC computation circuit of claim 14, further comprising:

a reference generator configured to generate reference voltage candidates; and a reference selector configured to select the reference voltage corresponding to the upper part of the digital output among the reference voltage candidates.

16. The MAC computation circuit of claim 15, wherein, for the generating of the reference voltage candidates, the reference generator is configured to determine at least a portion of the reference voltage candidates based on the analog output.

17. The MAC computation circuit of claim 14, wherein first output lines belonging to a first bit-cell group among the plurality of bit-cell groups share a first capacitor array, a first ADC circuit, and a second ADC circuit that are assigned to the first bit-cell group among the plurality of capacitor arrays, the plurality of first ADC circuits, and the plurality of second ADC circuits.

18. The MAC computation circuit of claim 17, wherein the first capacitor array comprises:

a first capacitor configured to sample outputs of output lines of a first sub-group among the first output lines; and a second capacitor configured to sample outputs of output lines of a second sub-group among the first output lines, and the first ADC circuit and the second ADC circuit operate based on a pipeline.

19. The MAC computation circuit of claim 14, wherein for the determining of the upper part, the first ADC circuits are configured to compare the analog output to coarse ranges according to primary reference voltages and determine a first range to which the analog output belongs among the coarse ranges, and for the determining of the lower part, the second ADC circuits are configured to compare the analog output to fine ranges of the first range according to secondary reference voltages including the reference voltage and determine a second range to which the analog output belongs among the fine ranges.

20. A multiply-accumulate (MAC) computation method comprising:

generating an analog output corresponding to a MAC operation result of an input signal, using a bit-cell array;

converting a current value of the analog output into a voltage value, using a capacitor array;

receiving the voltage value of the analog output and determining an upper part of a digital output corresponding to the analog output, using a first analog-to-digital conversion (ADC) circuit;

setting a reference voltage of a second ADC circuit based on the upper part; and receiving the voltage value of the analog output and determining a lower part of the digital output, using the second ADC circuit, wherein the first ADC circuit is a successive approximation register (SAR) ADC circuit, and the second ADC circuit is a flash ADC circuit.

21. An electronic apparatus comprising:

a bit-cell array configured to generate an analog output corresponding to a multiply-accumulate (MAC) operation result of an input signal;

a capacitor array configured to convert a current value of the analog output into a voltage value;

a first analog-to-digital conversion (ADC) circuit configured to receive the voltage value of the analog output and determine high-order bits of a digital output corresponding to the analog output by comparing the analog output to one or more primary reference values determined based on a maximum value of an input signal value range; and a second ADC circuit configured to receive the voltage value of the analog output and determine low-order bits of the digital output by comparing the analog output to one or more secondary reference values determined based on the primary reference values, wherein the first ADC circuit is a successive approximation register (SAR) ADC circuit, and the second ADC circuit is a flash ADC circuit.

22. The apparatus of claim 21, wherein, for the determining of the high-order bits, the first ADC circuit is configured to determine a highest-order bit of the high-order bits by comparing the analog output to a primary reference value of the one or more primary reference values that is half of the maximum value of the input signal value range.

23. The apparatus of claim 21, wherein a value of the analog output and the secondary reference values are within a range of a first primary reference value and a second primary reference value of the one or more primary reference values.

24. The apparatus of claim 21, further comprising a processor configured to generate a recognition result of an input corresponding to the input signal, based on the digital output.

* * * * *